United States Patent [19]

Kikuoka et al.

[11] 4,377,787

[45] Mar. 22, 1983

[54] SYSTEM FOR MEASURING STATE OF CHARGE OF STORAGE BATTERY

[75] Inventors: Takao Kikuoka, Honjoh; Hiroaki Yamamoto, Fukaya; Noriyoshi Sasaki, Honjoh; Kotaro Wakui, Mitaka; Keinosuke Murakami, Machida; Kazunori Ohnishi; Gou Kawamura, both of Tokyo; Hiroshi Noguchi, Higashikurume; Fumio Ukigaya, Higashiyamato, all of Japan

[73] Assignees: Shin-Kobe Electric Machinery Co., Ltd.; Nippon Hōsō Kyōkai (The Japan Broadcasting Corporation); Hitachi, Ltd.; Hitachi Denshi Kabushiki Kaisha, all of Tokyo, Japan

[21] Appl. No.: 176,356

[22] Filed: Aug. 8, 1980

[30] Foreign Application Priority Data

Aug. 14, 1979 [JP] Japan ............................. 54-103382

[51] Int. Cl.³ .......................................... G01N 27/42
[52] U.S. Cl. .................................. 324/431; 324/426; 324/427
[58] Field of Search ............................. 324/425–428, 324/429, 430, 431, 433; 320/48

[56] References Cited

U.S. PATENT DOCUMENTS 3,971,980 7/1976 Jungfer ............................. 324/427
4,295,097 10/1981 Thompson ......................... 324/426

Primary Examiner—Michael J. Tokar
Attorney, Agent, or Firm—Pearne, Gordon, Sessions, McCoy & Granger

[57] ABSTRACT

A system for measuring the state of charge of a storage battery is disclosed which corrects charging and discharge electrical quantities of the battery in view of temperature and charging efficiency of the battery, and the like to precisely measure the state of charge thereof by digital-operation. There is also disclosed a system correcting, by digital-operation, the variation in capacity of the battery due to the variation in life of the battery and/or the self-discharge thereof as well, to thereby measure the state of charge with higher precision.

28 Claims, 6 Drawing Figures

SYSTEM FOR MEASURING STATE OF CHARGE OF STORAGE BATTERY

BACKGROUND OF THE INVENTION

1. Field of the Invention

This invention relates to a system for measuring the state of charge of a storage battery, and more particularly to a system for detecting the quantity of electricity of a storage battery to measure the state of charge thereof, the degree of charge thereof and the like.

2. Description of the Prior Art

Recently, a storage battery such as a nickel-cadmium accumulator, a lead-acid accumulator or the like has been frequently used as a power source for portable electrical apparatus. Such storage battery cannot constantly supply electricity of a desired level to a load for a long time, accordingly, it is required to charge a storage battery after supplying electricity to a load for a certain time. In order to continuously and normally operate an electrical apparatus, it is important to know, during the discharge of a storage battery, the quantity of electricity which the battery can further supply to a load to normally operate the load. For this purpose, equipment has been conventionally used which acts to measure the state of charge of a storage battery. Such conventional measuring equipment is generally constructed to directly measure the quantity of electricity charged into a storage battery or discharged therefrom to indicate the state of charge thereof. However, because the measurement of electrical quantity of a storage battery is greatly affected by temperature and charging efficiency thereof, and the like as well known in the art, it is substantially impossible to precisely determine the state of charge of a storage battery by measuring only the quantity of charging or discharging electricity thereof; thus, in the conventional measuring equipment, it has been required to correct measured electrical quantity in view of the influences due to temperature and charging efficiency of a storage battery, and the like.

However, such conventional measuring equipment as mentioned above is adapted to conduct such correction by analog-operation, the analog-operation being not capable of precisely accomplishing the correction; thus, the conventional measuring equipment does not allow the state of charge of a storage battery to be precisely detected. In addition, in order to precisely measure the state of charge of a storage battery, it is also required to correct measured values in view of the life variation thereof and the capacity variation thereof due to the self-discharge at the time when the storage battery is connected to neither a charger nor a load. However, the conventional measuring equipment of the type of analog-operation does not precisely accomplish such correction.

BRIEF SUMMARY OF THE INVENTION

The present invention is intended to eliminate the above-mentioned disadvantages of the prior art.

Accordingly, an object of the present invention is to provide a system for measuring the state of charge of a storage battery which can precisely conduct a correcting operation in view of time and charging efficiency of the battery to measure and indicate the state of charge thereof with precision.

Another object of the present invention is to provide a system for measuring the state of charge of a storage battery which can precisely make a correction in connection with the capacity variation of a storage battery due to the life variation or self-discharge thereof as well to measure and indicate the state of charge thereof with high precision.

Still another object of the present invention is to provide a system for measuring the state of charge of a storage battery which can precisely make a correcting operation in connection with the capacity variation of a storage battery due to both of the life variation and self-discharge thereof as well to measure and indicate the state of charge thereof with higher precision.

According to the present invention, there is provided a system for measuring the state of charge of a storage battery comprising an electrical quantity detecting section for detecting charging and discharging electrical quantities of the storage battery and outputting the detected electrical quantities as digital signals, a temperature detecting section for detecting a temperature of the battery and outputting the detected temperature as a digital signal, a memory means having data and operational equations previously stored therein which are necessary to calculate an effective discharge electrical quantity and an effective discharge time of the battery based on the detected electrical quantities and temperature, a digital-operation processing section for calculating the effective discharge electrical quantity and effective discharge time based on the signals output from the electrical quantity and temperature detecting sections and the data and equations stored in the memory means, and an indicating section for indicating the effective discharge electrical quantity and/or time.

According to another aspect of the present invention, there is provided a system for measuring the state of charge of a storage battery further comprising a capacity measuring section for discharging an electricity from the battery to a reference load connected to the battery to measure a capacity of the battery; the digital-operation processing section being adapted to calculate a discharge capacity of the battery at a standard temperature based on the capacity of the storage battery, the signal output from the temperature detecting section and the data stored in the memory means, to thereby correct the variation in capacity of the battery due to the variation in life thereof.

According to still another aspect of the invention, there is provided a system for measuring the state of charge of a storage battery further comprising a time detecting section for integrating a shelf time of the battery and converting the integrated time into a digital time, the digital-operation processing section being adapted to correct the variation in discharge capacity of the battery due to the self-discharge.

In further accordance with the invention, there is provided a system for measuring the state of charge of a storage battery further comprising such temperature detecting section and time detecting section as mentioned above.

BRIEF DESCRIPTION OF THE DRAWINGS

Other objects and many of the attendant advantages of this invention will be readily appreciated as the same becomes better understood by reference to the following detailed description when considered in connection with the accompanying drawings, in which like reference characters designate the same or similar parts throughout the figures thereof and wherein.

DETAILED DESCRIPTION OF THE PREFERRED EMBODIMENTS

Figure 1:
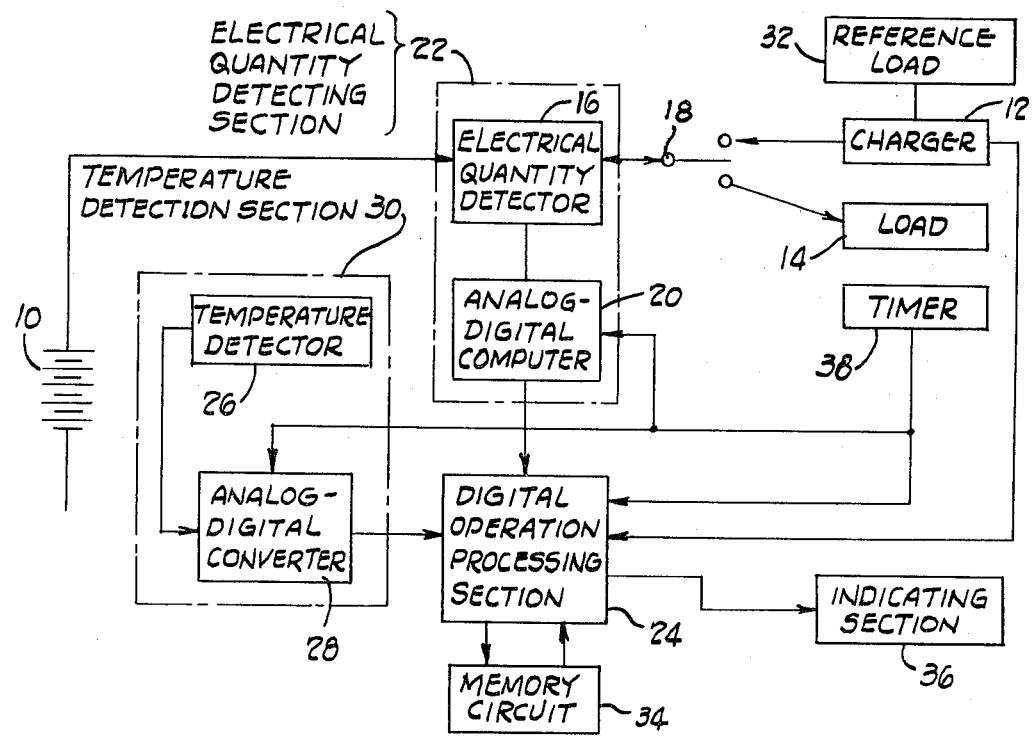
FIG. 1 is a block diagram showing one embodiment of a system for measuring the state of charge of a storage battery according to the present invention.

FIG. 1 is a block diagram schematically showing one embodiment of a system for measuring the state of charge of a storage battery according to the present invention wherein a nickel-cadmium accumulator is used as a storage battery. The term "the state of charge of a storage battery" as used herein and as understood in the art, is intended to indicate a capacity for further discharge which remains in the battery and is capable of normally operating a load. In FIG. 1, reference numeral 10 designates a nickel-cadmium accumulator, reference numeral 12 designates a charger for charging the battery 10, reference numeral 14 designates a load such as a portable videotape recorder, a portable television camera or the like which is energized by the battery 10, and reference numeral 16 designates an electrical quantity detector to integrate a charging or discharge current of the battery 10 to output an analog signal indicating the quantity of electricity charged into or discharged from the battery 10. In the embodiment as illustrated, the charger 12 and load 14 are adapted to be alternatively connected through the detector 16 to the battery 10 by means of a change-over switch 18; so that the charger 12 may be connected through the detector 16 to the battery 10 during charging the battery, while, the load 14 may be connected through the detector 16 to the battery during the discharge of the battery.

The detector 16 may be composed of, for example, a resistor of a small resistivity connected in series with a circuit through which charging and discharge currents of the battery 10 flow and a potential memory element connected in parallel with respect to the resistor. The potential memory element acts to output a voltage proportional to the quantity of electricity flowing therethrough. One of such elements suitable for use in the present invention is commercially available from Sanyo Electric Co., Ltd., Osaka, Japan, which is sold under the trade name "Memoriode". Alternatively, a coulombmeter or the like may be used as the detector 16. The analog voltage, namely, analog signal proportional to the quantity of electricity charged into the battery 10 which is output from the detector 16 is connected as an input to an analog-digital converter 20 to be converted to a digital signal. Accordingly, it should be noted that the detector 16 and analog-digital converter 20 constitute an electrical quantity detecting section 22 which acts to detect the quantity of electricity charged into the battery and that discharged therefrom to output each of the detected electrical quantities as a digital signal, the digital signals obtained from the converter 20 being adapted to be an input to a digital-operation processing section 24.

A temperature detector 26 is disposed adjacent to the storage battery 10 which acts to detect a temperature of the battery 10. The temperature detector 26 may be composed of, for example, a temperature detecting element outputting a current proportional to the absolute temperature, and a resistor and a DC power source connected in series to the detecting element so as to obtain a temperature detecting voltage proportional to the absolute temperature from the both ends of the resistor. One of such temperature detecting elements suitable for use in the present invention is commercially available from Analog Devices, Inc., U.S.A., which is sold under the trade name "AD 590". The temperature detecting signal output from the temperature detector 26 is connected to an analog-digital converter 28, to thereby be converted into a digital signal. Consequently, in the embodiment as shown in FIG. 1, it should be noted that the temperature detector 26 and analog-digital converter 28 constitute a temperature detecting section 30 which acts to detect a temperature of the storage battery 10 to convert the detected temperature into a digital signal. Further, the digital signal output from the converter 28 is connected to the digital-operation processing section 24.

Also to the digital-operation processing section 24, data indicating the number of charges are connected as an input from the charger 12, the data being utilized to determine a time of measuring the life variation of discharge capacity of the storage battery 10. In order to measure the life variation of discharge capacity of the storage battery and to measure the state of charge thereof with precision, a reference load 32 is provided with respect to the charger 12. In the embodiment as illustrated, the reference load 32 is connected to the charger 12. The reference load 32 is adapted to be connected to the storage battery 10 every time the charging operation of the predetermined number of times is conducted, so that the detecting section 22 may actually measure the discharge capacity of the battery 10 when electricity is discharged from the battery through the reference load 32 until the battery reaches the final discharge voltage. The information as to discharge capacity detected by the detecting section 22 is connected to the digital-operation processing section 24. The term "final discharge voltage" as used herein is intended to mean the voltage of a storage battery at the end of discharge.

In FIG. 1, reference numeral 34 designates a memory circuit for storing therein data and operational equations which the operation processing section 24 requires for conducting a digital-operation. Reference numeral 36 designates an indicating section which is connected to an output end of the processing section 24 to indicate required results among results of an operation by the processing section 24.

In the embodiment shown in FIG. 1, the analog-digital converters 20 and 28, digital-operation processing section 24, and memory circuit 34 are adapted to be energized by the storage battery 10. In order to reduce the internal resistance of the storage battery 10 to allow a large amount of power to be supplied to the load 14, it is necessary to reduce, as much as possible, the power consumed by the circuit of the system. For this purpose, in the embodiment, a timer 38 is incorporated in the system. The timer 38 is adapted to act in such a manner that the analog-digital converters 20 and 28, digital-operation processing section 24, and memory circuit 34 are energized at regular intervals, for example, one time every five minutes by a signal from the timer 38 to accomplish the respective operations, and the supply of power to each of these components is automatically interrupted after the digital-operation of the operation processing section 24. The timer 38 is also adapted to stop the operation of the converter 20 and the digital-operation of the operation processing section 24 when the storage battery 10 is connected to neither the charger 12 nor load 14, and to input to the operation processing section 24 data obtained by integrating the time (shelf time) during which the storage battery has been connected to neither the charger nor load when the storage battery is connected to either the charger or the load. In addition, when the storage battery 10 is connected to neither the charger 12 nor load 14, the timer 38 acts to give a command to the temperature detecting section 30 to cause the section 30 to detect a temperature of the storage battery 10 and to cause the detected temperature to be stored in the memory circuit 34. The temperature and time of the storage battery at the time when the storage battery has been connected to neither the charger nor load, which are stored in the memory circuit 34, are utilized as data for correcting the variation in capacity of the storage battery due to the self-discharge thereof. When the storage battery is connected to either the load 14 or charger 12, the digital-operation processing section 24 conducts the operation of correcting the variation in discharge capacity of the storage battery due to the self-discharge to calculate the state of charge of the storage battery and the like.

The digital-operation processing section 24 conducts not only the calculation of an effective electrical quantity which the storage battery can still discharge (hereinafter referred to as "effective discharge electrical quantity") and/or an effective time for which the storage battery can discharge at an effective voltage (hereinafter referred to as "effective discharge time"), but also the calculation of charging degree of the storage battery, the calculation of life variation in discharge capacity of the storage battery at a standard temperature and the correction of capacity variation of the storage battery due to the self-discharge thereof. Data and operational equations required for conducting such operations are stored in the memory circuit 34, such data and equations depending on the type of storage battery and parameters to be chosen. Where a nickel-cadmium accumulator is used, the following data are stored in the memory circuit 34:

(i) The relationship between the ratio f(T) and the temperature Tb, where the ratio f(T) is the discharge capacity of a storage battery at a battery temperature Tb [°C.] at the time of discharge to the discharge capacity $Q_o$ [Ah] of the battery at a standard temperature (hereinafter referred to as "standard discharge capacity")

(ii) The relationship, for two battery temperatures, between the charging efficiency $\eta_c$ of the storage battery and the ratio $Q_{cs}/Q_o$ (charging rate) of the degree of charge $Q_{cs}$ [Ah] of the battery to the standard discharge capacity $Q_o$; and (iii) The relationship, for two battery temperatures, between a self-discharge current $\eta_{SD}$ [mA] of the battery and the ratio $Q_{cs}/Q_o$ (charging rate) of the degree of charge $Q_{cs}$ to the standard discharge capacity $Q_o$.

Figure 2:
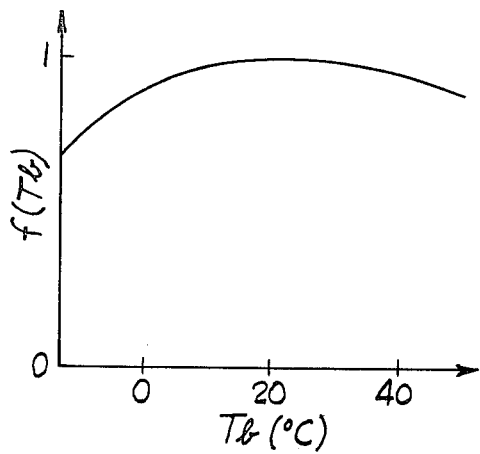
FIG. 2 is a graph showing one example of characteristics between a temperature of a storage battery and the ratio of a discharge capacity thereof at the time of discharging to a standard discharge capacity thereof.
Figure 3:
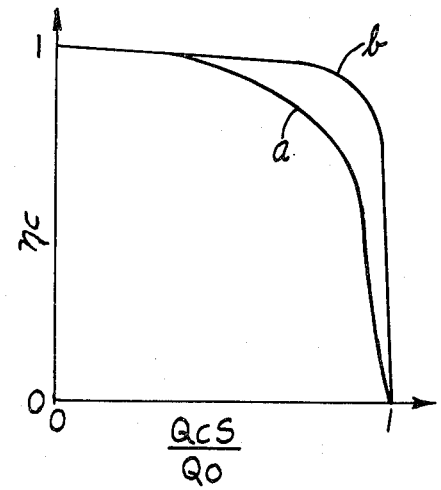
FIG. 3 is a graph showing one example of the relationship between the charging efficiency of a storage battery and the degree of charge thereof wherein a temperature of the storage battery is employed as a parameter.
Figure 4:
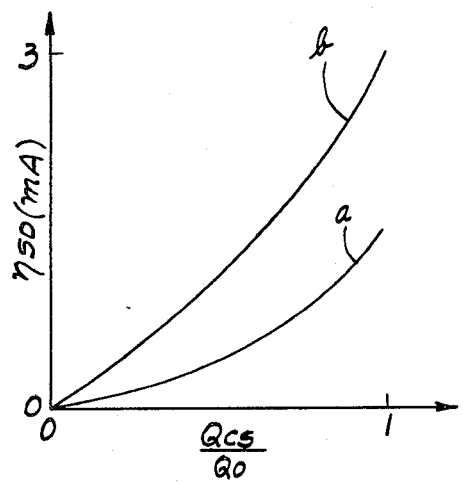
FIG. 4 is a graph showing one example of the relationship between a self-discharge current of a storage battery when the battery is connected to neither a load nor a charger and the degree of charge thereof, wherein a temperature of the storage battery is adopted as a parameter.

The above data are previously obtained according to an empirical formula and the like. FIGS. 2 to 4 show examples of the data (i) to (iii), respectively. Curves (a) and (b) of FIGS. 3 and 4 are concerned with informations at battery temperatures of 0° C. and 20° C., respectively.

As mentioned above, the system for measuring the state of charge of a storage battery according to the present invention is constructed in the manner that all the data used for correction are stored in the memory circuit 34; accordingly, the system can precisely measure the state of charge of various storage batteries only by changing the data to be stored in the memory circuit depending on a storage battery, because it is not required to change the circuit itself depending on a storage battery type, or to change a load to be incorporated therein, as seen in a conventional analog measuring system.

The digital-operation processing section 24 reads a voltage value input thereto from the analog-digital converter 20, and calculates the quantity of electricity $Q_d$ discharged from the battery 10 or that $Q_c$ charged thereto during the reading operation based on a difference between this value read by the converter 20 and the read value previously stored in the memory circuit 34, and the variation in output voltage of the detector 16 previously stored in the memory circuit 34 and a proportional factor between the quantity of charged electricity and the quantity of discharged electricity. Also, the operation processing section 24 conducts operations, explained below, based on the calculated electrical quantities $Q_d$ and $Q_c$; the battery temperature detected by the temperature detecting section 30; the number of charges performed by the charger 12 and the time (shelf time) during which the battery is connected to neither the charger 12 nor load 14, the shelf time being informed by the timer 38; and the data stored in the memory circuit 34. Results of the operations are indicated by the indicating section 36.

(1) Calculation of the state of charge of a storage battery:

When the storage battery 10 is connected to the load 14 for the purpose of discharging, the system calculates and indicates the state of charge of the battery 10. The state of charge of a storage battery is generally indicated by either an effective discharge electrical quantity $Q_r$ of the battery or an effective discharge time thereof. The system of the present invention may indicate the state of charge of the battery 10 by an effective discharge electrical quantity thereof and/or an effective discharge time thereof. The effective discharge electrical quantity $Q_r$ of the battery 10 may be calculated according to the following operational equation ①
based on the electrical quantity $Q_d$, the battery temperature Tb, and the data stored in the memory circuit.

$$Q_r = Q_o\{f(Tb) - 1\} + Q_{cs}' - \Sigma Q_d \quad \ldots \text{①}$$

wherein, $Q_o$ indicates the standard discharge capacity of the battery 10, $Q_{cs}'$ indicates the degree of charge of the battery at the time of completion of the previous charge (the calculation of the degree of charge of the battery will be hereinafter explained), and $\Sigma Q_d$ indicates the total discharge electrical quantity of the battery in the present discharge. The function f(Tb) is shown, for example, in FIG. 2. The effective discharge time of the battery 10 can be obtained by dividing the effective discharge electrical quantity $Q_r$ [Ah] by a discharge current of the battery 10. The effective discharge electrical quantity and/or discharge time of the battery 10 so obtained are indicated by the indicating section 36.

(2) Calculation of the degree of charge of a storage battery:

The degree of charge of the battery 10, namely, the electrical quantity $Q_{cs}$ charged in the battery 10 is calculated according to the following operational equation ② based on the charging electrical quantity $Q_c$, the battery temperature Tb, a charging time $t_k$ until the number of data readings reaches k, and the data stored in the memory circuit 34;

$$Q_{cs}(t_k) = Q_{cs}(t_{k-1}) + \eta_c\left(Tb, \frac{Q_{cs}(t_{k-1})}{Q_o}\right) \cdot Q_c \quad \text{②}$$

wherein $Q_{cs}(t_k)$ indicates the degree of charge of the battery when the number of information readings reaches k. The degree of charge of the battery 10 at the start of charging is calculated according to the following operational equation ③ ;

$$Q_{cs}(t_o) = Q_{cs}' - \Sigma Q_d \quad \ldots \text{③}$$

The function $\eta_c$ (Tb, $Q_{cs}(t_{k-1})/Q_o$) is shown, for example, in FIG. 3.

The degree of charge $Q_{cs}$ of the battery is calculated at regular intervals predetermined by the timer 38, results of the calculation being indicated by the indicating section 36. Such indication of the state of charge of the storage battery has advantages, for example, of allowing the charging progress of each of plural storage batteries charged simultaneously to be detected and allowing the completion of charging of each storage battery to be easily detected, accordingly, the system according to the present invention enables a program with respect to the use of a storage battery to be easily planned. It should be noted that, in the embodiment shown in FIG. 1, it is essential to calculate the degree of charge of the battery, however, it is not essential to indicate results of the calculation.

When the charging of the storage battery 10 is completed, the degree of charge $Q_{cs}$ at this time is compared with the standard discharge capacity $Q_o$; as a result thereof, the smaller value of the two is stored in the memory circuit 34.

(3) Operation for correcting a capacity variation of a storage battery due to the self-discharge thereof:

Even when the storage battery 10 does not supply power to the load 14, it generally has a self-discharge. Accordingly, in order to precisely calculate the state of charge thereof, it is required to calculate the quantity of electricity lost due to the self-discharge and to correct the state of charge in view of the lost electrical quantity. For this purpose, where the storage battery has been connected to neither the charger 12 nor load 14, the system of the present invention is adapted to calculate, at the start of discharge, the degree of charge $Q_{cs}$ corrected in view of the quantity of electricity lost due to the self-discharge according to an operational equation ④ to follow based on a battery temperature Tb at which the battery 10 has been connected to neither the load nor the charger, a shelf time $t_l$ of the battery until the number of data readings reaches l, and the data stored in the memory circuit 34;

$$Q_{cs}(t_l) = Q_{cs}(t_{l-1}) - \eta_{SD}\left(Tb, \frac{Q_{cs}(t_{l-1})}{Q_o}\right) \cdot (t_l - t_{l-1}) \quad \text{④}$$

wherein, $Q_{cs}(t_l)$ indicates the degree of charge of the battery when the number of data readings is l, the function $\eta_{SC}$(Tb, $Q_{cs}(t_{L-1})/Q_o$) is indicated, for example, in FIG. 4. In addition, the degree of charge at the time when the battery 10 starts to be disconnected from both the charger and the load is calculated according to the following operational equation ⑤ ;

$$Q_{cs}(t_o) = Q_{cs}' - \Sigma Q_d \quad \ldots \text{⑤}$$

Also, an effective discharge electrical quantity $Q_r$ of the battery is calculated according to the equation ① by substituting the degree of charge $Q_{cs}$ calculated by the equation ④ for $Q_{cs}'$ in the equation ① .

(4) Operation for correcting the variation in capacity of a storage battery due to the variation in life thereof:

In general, a storage battery gradually decreases in capacity as the number of discharge cycles increases, and it is considered at the end of life and exchanged when the discharge capacity thereof reduces by 50% or less. Such life variation causes the state of charge calculated above to have a significant error, supposing that the standard discharge capacity $Q_o$ of the storage battery is constant over the period of using the battery. The following are generally employed as methods for permitting a standard discharge capacity of a battery approximate to the state of charge thereof:

(a) A method of correcting by operation a standard discharge capacity of a storage battery based on a relationship between the period of use of the battery, the number of charging and discharge cycles, the integrated quantity of discharge electricity, the integrated quantity of excessively charging electricity and the like, and the life variation; the relationship being previously obtained and stored in the memory circuit 34; and (b) A method of actually measuring a capacity of a storage battery by actually discharging the battery after the complete charging of the battery and correcting the measured capacity in view of a temperature of the battery, to thereby use the corrected capacity as a standard discharge capacity thereof.

The system of the present invention may employ the methods (a) and/or (b) mentioned above, however, the embodiment shown in FIG. 1 preferably corrects the state of charge of the battery in view of the life variation by the method (b). For this purpose, the system of FIG. 1 is adapted to actually measure a capacity of the storage battery 10 by connecting the reference load 32 to the charger 12 and connecting the reference load 32 to the battery 10 after completely charging the battery to detect the quantity of electricity discharged from the battery 10. In this connection, as a method of actually measuring a capacity of a storage battery, either a method of measuring a capacity of a storage battery based on a relationship between the discharge voltage and the capacity previously measured by instantaneously discharging the battery or a method of actually measuring a capacity of a storage battery by completely discharging the battery until the battery reaches the final discharge voltage has been generally employed. In connection with a nickel-cadmium accumulator, it is substantially impossible to measure a capacity thereof only by instantaneously discharging it because the variation in discharge voltage thereof is less; accordingly, the system of FIG. 1 is desired to employ a method of discharging the battery 10 until it reaches the final discharge voltage. It is preferable that the measurement of capacity of the battery 10 is conducted every time that the charging operation is repeated predetermined times, for example, 30 times and the battery 10 is charged after the completion of each measurement. The number of charges is measured by a counter contained in the charger 12. When the number of charges reaches a predetermined level, a signal indicating a time of measuring a capacity of the battery 10 is supplied to the digital-operation processing section 24. Upon receiving the signal, the processing section 24 gives a command to the charger 12 so that the system conducts a charging-discharging operation of measuring a capacity of the battery, namely, "charge"→"complete discharge until the battery reaches the final discharge voltage"→"charge". When the battery 10 reaches the final discharge voltage, the processing section 24 calculates a standard discharge capacity $Q_o$ of the battery based on the charging electrical quantity of the battery 10 detected by the electrical quantity detecting section 22, the battery temperature Tb measured by the temperature detecting section 30 and the function f(Tb); results of the calculation being used as a standard discharge capacity of the battery in a charging-discharging operation of the predetermined number of cycles, for example, 30 cycles. The correction of standard discharge capacity of the battery may be conducted every charging, however, satisfactory results can be obtained by correction every predetermined number of cycles.

As mentioned above, the system of the present invention is adapted to correct a standard discharge capacity of a storage battery incorporated therein every charging-discharging operation of the predetermined number of cycles, the state of charge of the storage battery can be precisely measured even at the end of life. In addition, according to the system of the present invention, it is possible to precisely measure an actual capacity of a storage battery incorporated therein; therefore, if necessary, the variation in life of the battery can be indicated by the ratio of the actual capacity to a specified capacity thereof. Thus, the system of the present invention is capable of giving a warning by means of a red signal or the like when a capacity of the storage battery lowers below the working limit.

The embodiment shown in FIG. 1 is constructed so that charging and discharge electrical quantities of the storage battery 10 are detected by the detector 16 which acts to generate an output signal proportional to the electrical quantities. However, the system of the present invention may be constructed in such a manner that charging and discharging currents of the storage battery 10 are measured by a current detector, for example, a resistor of a small resistivity connected in series to a circuit through which the charging and discharging currents flow, and the detected value of the currents is connected through the analog-digital converter 20 to the digital-operation processing section 24 so that the charging and discharging currents are respectively integrated as the function of time in the processing section 24. Alternately, such integration may be conducted by intermittently actuating the converter 20 and processing section 24 by the timer 38 to measure a current at predetermined intervals, for example, every five minutes and integrating the measured current over the total time to detect charging and discharge electrical quantities of the battery. Such alternative method allows the charging and discharge electrical quantities to be precisely calculated when the variation in load is less, and has an advantage of reducing the power consumed by the circuit of the system.

The embodiment shown in FIG. 1 may be practiced, for example, by connecting the storage battery 10 to a unit comprising the electrical quantity detector 16, temperature detecting section 30, digital-operation processing section 24, memory circuit 34, timer 38 and indicating section 36, and connecting the charger 12 to the unit when connecting the battery 10 to the charger 12; to thereby allow desired signals to be exchanged between the charger and the unit. In addition, in the case that the load 14 such as a portable videotape recorder, a portable television camera or the like can be provided with a terminal for connecting the load to the charger 12 to allow the storage battery 10 to be charged in the state that the battery 10 is connected to the load 14, it is possible to incorporate the elements of the system except the charger 12 in the load 14; while, when the load 14 is constructed to incorporate the charger 12 as well as the other elements therein, the whole system shown in FIG. 1 can be incorporated in the load 14. Furthermore, the system of the present invention may be constructed to allow common use of elements such as the analog-digital converters 20 and 26 to be commonly used.

Figure 5:
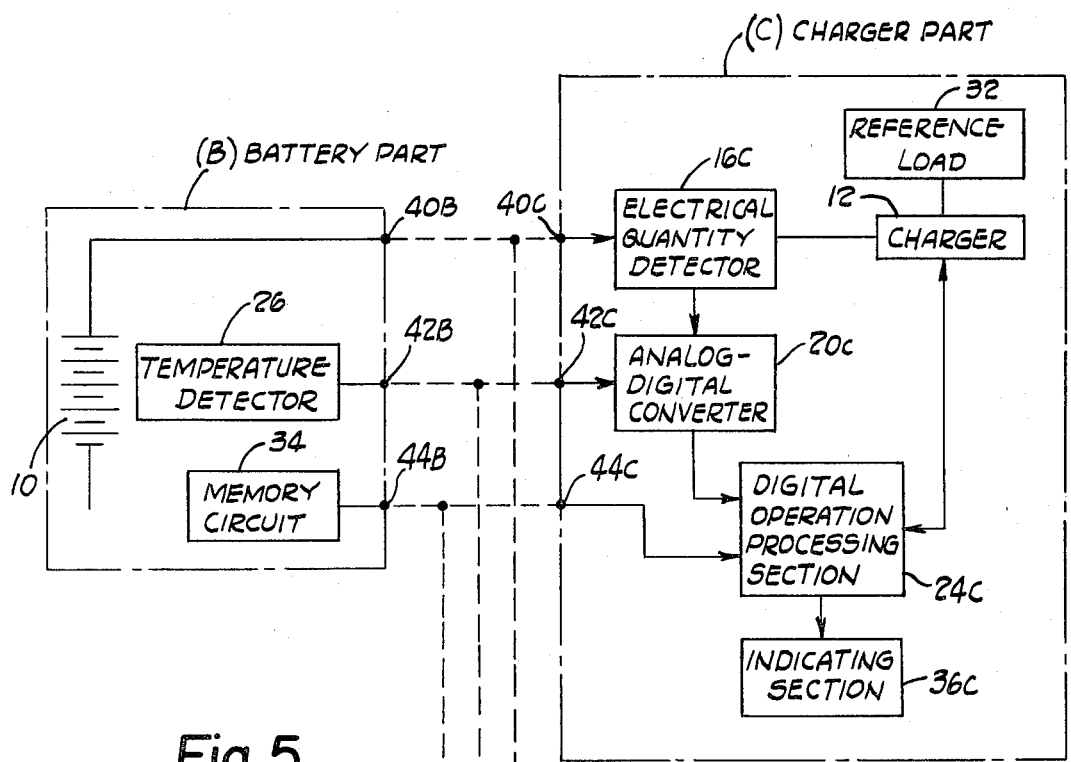
FIG. 5 is a block diagram showing another embodiment of a system for measuring the state of charge of a storage battery according to the present invention, wherein elements of the system are divided into three parts.
Figure 5:
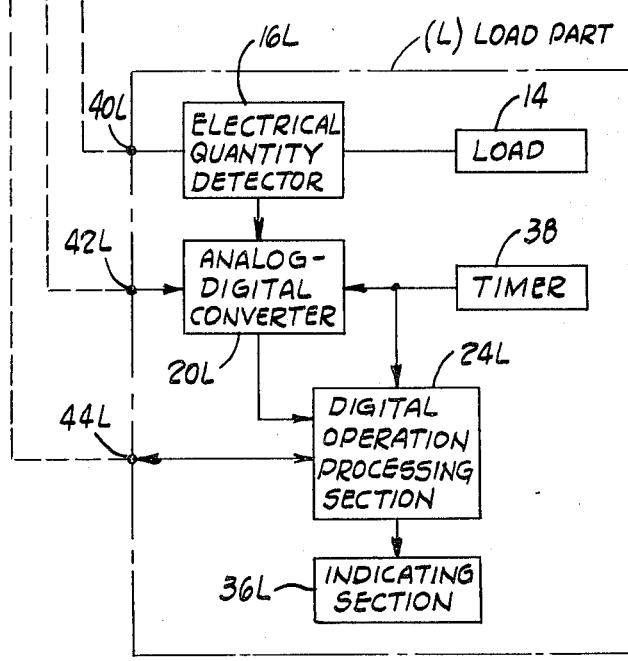
Figure 1:
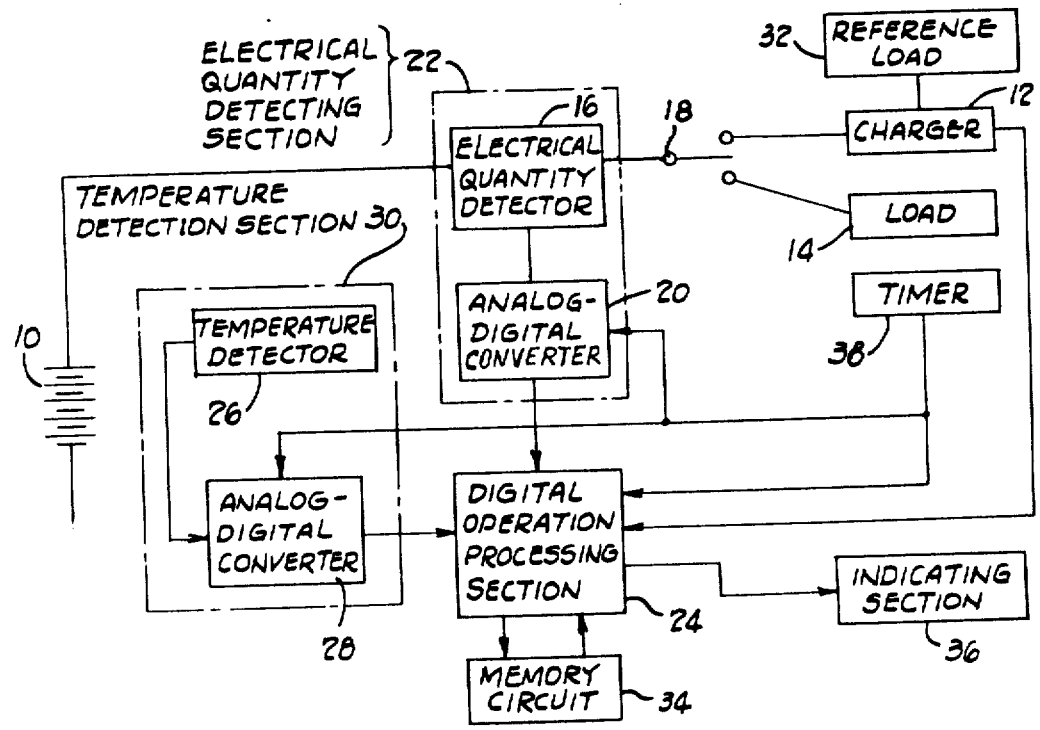
Figure 6:
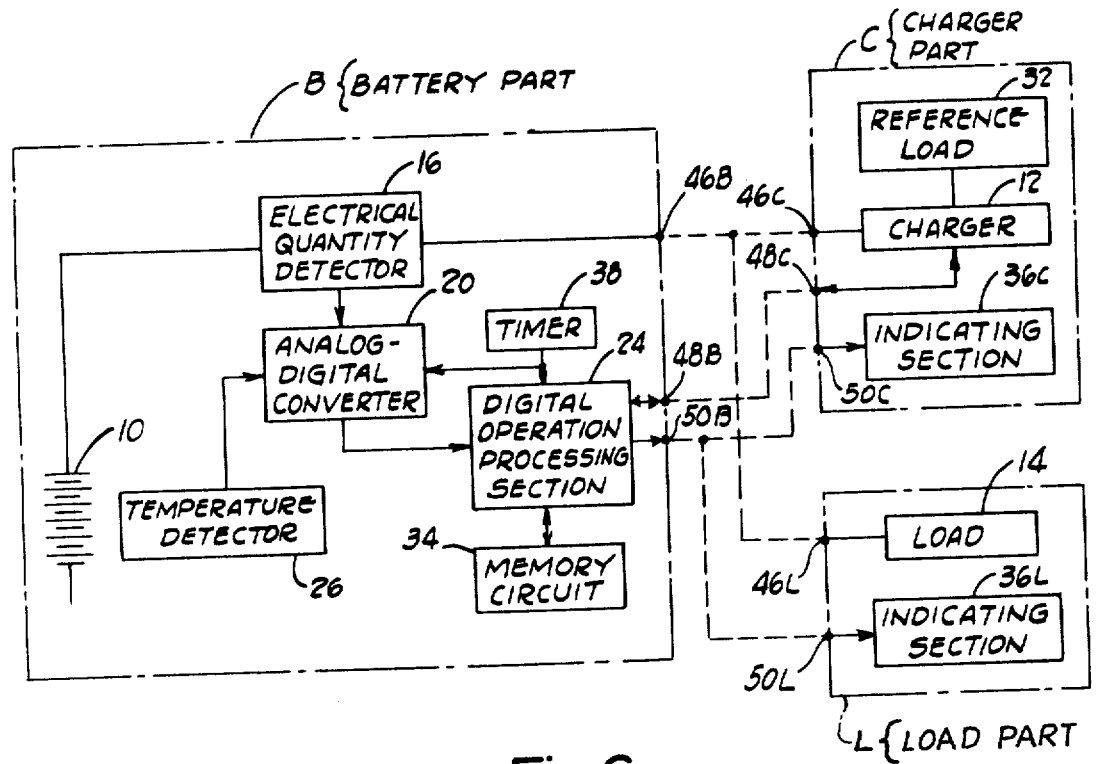
Figure 5:
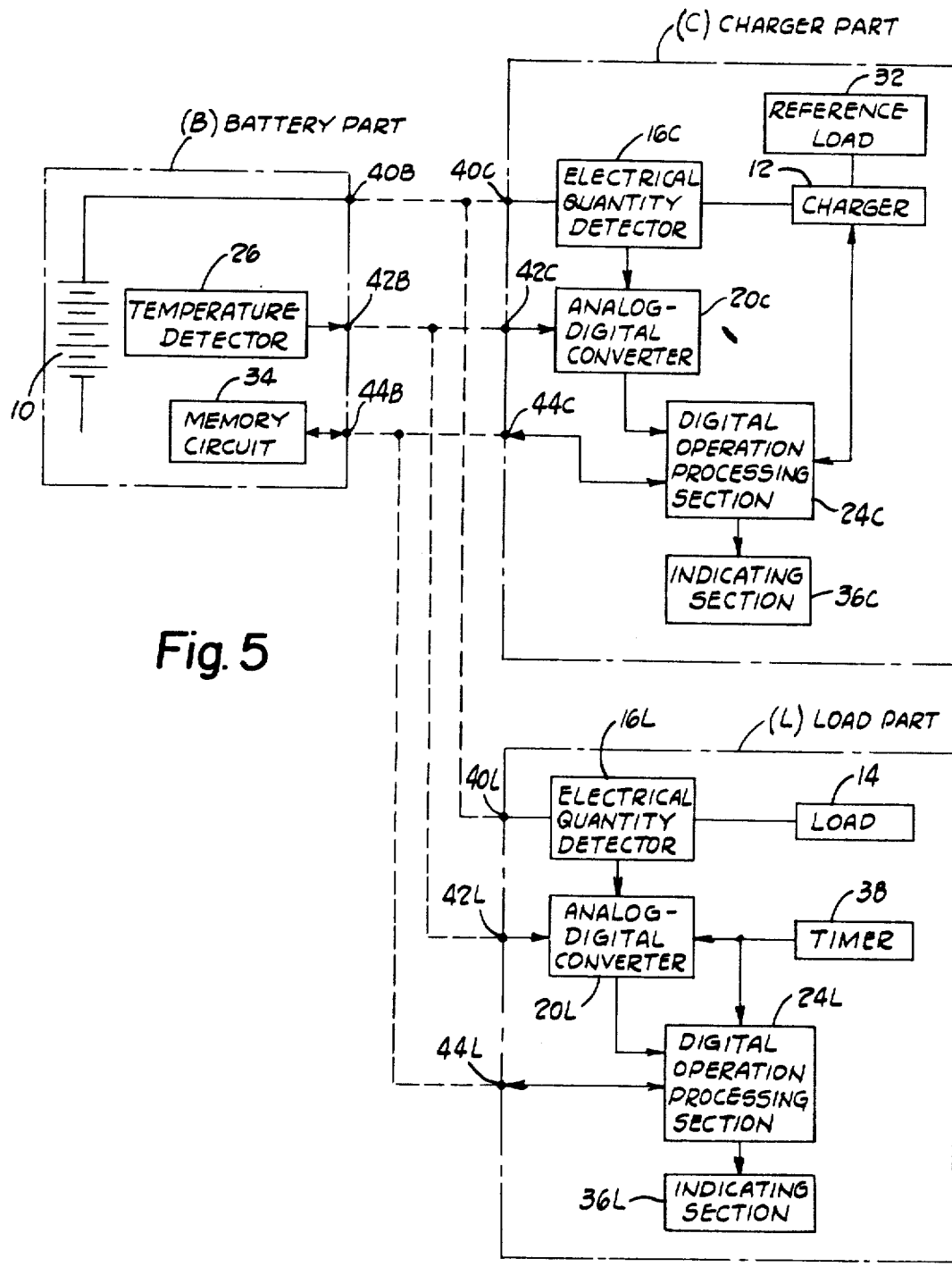

The elements of the system shown in FIG. 1 may be divided into, for example, three parts of a storage battery part, a charger part and a load part. FIG. 5 shows another embodiment of a system of the present invention wherein elements thereof are divided into three parts; reference characters B, C and L respectively designating a storage battery part, a charger part and a load part. In the system shown in FIG. 5, the storage battery part B is composed of a storage battery 10, a temperature detector 26 and a memory circuit 34; the detector 26 and memory circuit 34 being integrated with the battery 10. The charger part C consists of an electrical quantity detector 16C, an analog-digital converter 20C, a digital-operation processing section 24C, an indicating section 36C and a reference load 32; the detector 16C acting to detect only a charging electrical quantity of the battery 10. The load part L is composed of an electrical quantity detector 16L, an analog-digital converter 20L, a digital-operation processing section 24L, an indicating section 36L and a timer 38; the detector 16L acting to detect the quantity of discharge electricity of the battery 10. The analog-digital converters 20C and 20L are adapted to also convert an output signal of the temperature detector 26 into a digital signal, accordingly, it should be noted that each of the converters 20C and 20L alternately conduct the digital conversion of the temperature detecting signal and that of the electrical quantity. The charger part is constructed not to include a timer because the charger 12 is adapted to be connected to a commercial power source. The memory circuit 34 is incorporated in the storage battery part B because, in the embodiment, it is required that the memory circuit 34 stores informations common for conducting a digital-operation at the time of charging and that at the time of discharge.

The system of FIG. 5 may be practiced in such a manner that, at the time of charging, terminals 40B, 42B and 44B of the storage battery part B respectively connected to the storage battery 10, temperature detector 26 and memory circuit 34 are respectively connected to terminals 40C, 42C and 44C respectively connected to the electrical quantity detector 16C, analog-digital converter 20C and digital-operation processing section 24C of the charger part C. The indicating section 36C is adapted to indicate the degree of charge of the storage battery 10 and the variation of life thereof. In the case of operating the system at the state of connecting the battery 10 to the load 14, the terminals 40B, 42B and 44B of the storage battery part B are respectively connected to terminals 40L, 42L and 44L respectively connected to the electrical quantity detector 16L, analog-digital converter 20L and digital-operation processing section 24L of the load part L. In such case, the indicating section 36L is adapted to indicate at least one of an effective discharge electrical quantity and an effective discharge time of the battery 10.

Figure 6:
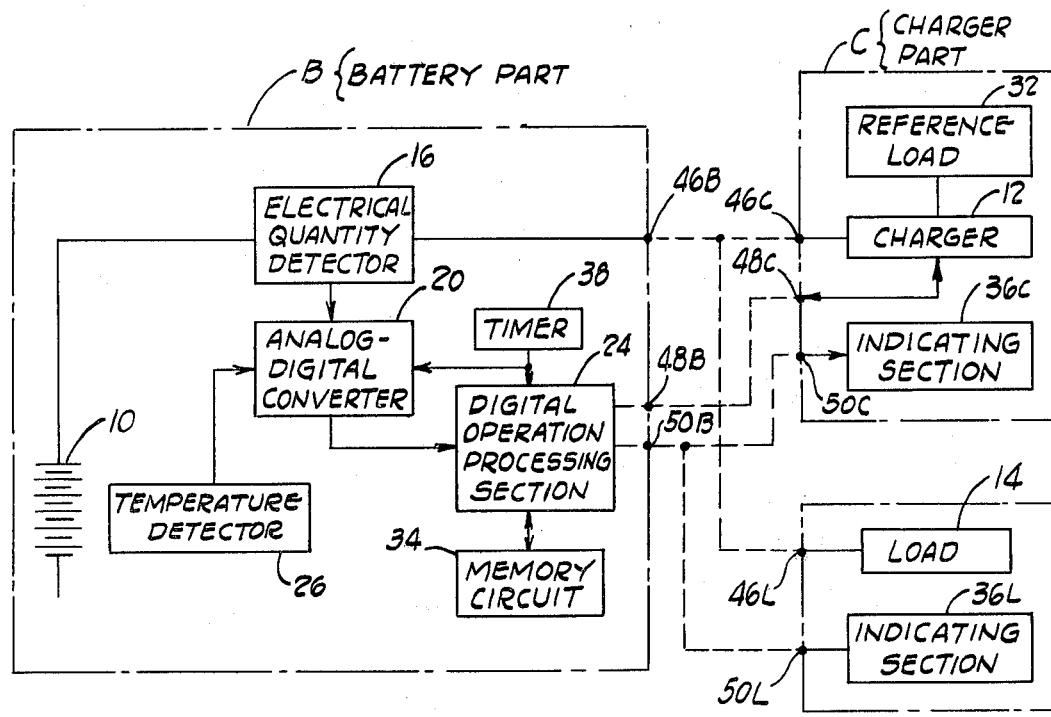
FIG. 6 is a block diagram showing still another embodiment of a system for measuring the state of charge of a storage battery according to the present invention, wherein elements of the system are divided into three parts, similarly to the embodiment of FIG. 5.

FIG. 6 shows still another embodiment of a system of the present invention wherein elements of the system are divided into three parts, similarly to the embodiment of FIG. 5. In the system of FIG. 6, a storage battery part B is composed of an electrical quantity detector 16 for detecting a charging current and a discharge current of a storage battery 10, an analog-digital converter 20, a digital-operation processing section 24, a temperature detector 26, a memory circuit 34 and a timer 38; and a charger part C includes a charger 12, a reference load 32 and an indicating section 36C. A load part L consists of a load 14 and an indicating section 36L.

The embodiment of FIG. 6 may be practiced so that, at the time of charging, an output terminal 46B of the detector 16, an output terminal 48B of the digital-operation processing section 24 connected to the charger 12 and an output terminal 50B of the processing section 24 of the storage battery part B are respectively connected to an output terminal 46C of the charger 12, an output terminal 48C of the charger 12 connected to the operation processing section 24 and a terminal 50C connected to the indicating section 36C of the charger part C. The terminal 48B of the operation processing section 24 comprises at least one terminal which receives a signal indicating the number of charges and outputs a command signal to the charger 12, and the terminal 48C of the charger 12 comprises at least one terminal which outputs a signal indicating the number of charges and receives a command signal from the operation processing section 24. When the storage battery is connected to the load 14, the terminals 46B and 50B of the storage battery part B are respectively connected to a terminal 46L of the load 14 and a terminal 50L of the indicating section 36L of the load part L.

Alternatively, a system of the present invention may be constructed in such a manner that it comprises two parts, namely, one part consisting of a storage battery and a load and the other part including a charger etc., or that it comprises one part consisting of a load and a charger and the other part including a storage battery etc.

In the embodiments mentioned above, the timer acts to intermittently actuate the analog-digital converters, digital-operation processing section and memory circuit. However, when using a storage battery having a large capacity, the timer may act to continuously actuate these elements.

As mentioned above, the present invention has an advantage of precisely accomplishing complicated operations in which various parameters are considered, to thereby measure the state of charge of a storage battery, because a correction is conducted by digital-operation. In addition, in considering another aspect of the system provided in accordance with the present invention, it is noted that the state of charge of a storage battery can be measured with high precision because the variation in life thereof or the variation in capacity thereof due to the self-discharge is adequately corrected. In further accordance with the present invention, it is recognized that the state of charge of a storage battery can be measured with higher precision because both of the variation in life thereof and the variation in capacity thereof are properly corrected.

Obviously many modifications and variations of the present invention are possible in the light of the above teachings. It is therefore to be understood that within the scope of the appended claims the invention may be practiced otherwise than as specifically described.

What is claimed is:

1. A system for measuring the state of charge of a storage battery comprising:
   an electrical quantity detecting section for detecting the quantity of electricity charged to said storage battery and the quantity of electricity discharged therefrom, and outputting said detected electrical quantities as digital signals;
   a temperature detecting section for detecting a temperature of said storage battery and outputting said detected temperature as a digital signal;
   a memory means including a first memory having at least data on the discharge capacity of said storage battery at said detected temperature with respect to the discharge capacity of said storage battery at a standard temperature stored therein, a second memory having data on the charging efficiency of said storage battery in relation to a charging rate of said storage battery and said detected temperature stored therein, and a third memory having operational equations stored therein which are necessary for calculating at least one of an effective electrical quantity which said storage battery can discharge and an effective time which said storage battery can discharge an effective quantity of electricity based on said detected electrical quantities and detected temperature of said storage battery;
   a digital-operation processing section for calculating at least one of said effective electrical quantity and said effective time by digital-operation based on said output signals of said electrical quantity detecting section and said temperature detecting section, and said data and operational equations stored in said memory means; and an indicating section for indicating at least one of said effective electrical quantity and said effective time so calculated.

2. A system for measuring the state of charge of a storage battery as defined in claim 1, wherein said temperature detecting section comprises a temperature detector disposed adjacent to said storage battery and an analog-digital converter acting to convert an output of said temperature detector into said digital signal.

3. A system for measuring the state of charge of a storage battery as defined in claim 2, wherein said electrical quantity detecting section comprises an electrical quantity detector for integrating a charging current and a discharge current of said storage battery to detect said charging electrical quantity and discharge electrical quantity of said storage battery, respectively, and an analog-digital converter for converting outputs of said electrical quantity detector into said digital signals.

4. A system for measuring the state of charge of a storage battery as defined in claim 3, wherein said temperature detector and electrical quantity detector continuously operate, and said analog-digital converters, digital-operation processing section and memory means intermittently operate.

5. A system for measuring the state of charge of a storage battery as defined in claim 2, wherein said electrical quantity detecting section comprises a current detector for detecting a charging current and a discharge current of said storage battery, an analog-digital converter for converting outputs of said electrical quantity detector into said digital signals, and an operation means for integrating outputs of said analog-digital converter as a function of time.

6. A system for measuring the state of charge of a storage battery as defined in claim 5, wherein said temperature detector and current detector continuously operate; and said analog-digital converters, operation means, digital-operation processing section and memory means intermittently operate.

7. A system for measuring the state of charge of a storage battery as defined in claim 5 or 6, wherein said digital-operation processing section also acts as said operation means.

8. A system for measuring the state of charge of a storage battery comprising:
an electrical quantity detecting section for detecting the quantity of electricity charged to said storage battery and the quantity of electricity discharged therefrom, and outputting said detected electrical quantities as digital signals;
a temperature detecting section for detecting a temperature of said storage battery and outputting said detected temperature as a digital signal;
a capacity measuring section for discharging electricity from said storage battery to a reference load connected to said storage battery to measure a capacity of said storage battery;
a memory means including a first memory having at least data on the discharge capacity of said storage battery at said detected temperature with respect to the discharge capacity of said storage battery at a standard temperature stored therein, a second memory having data on the charging efficiency of said storage battery in relation to a charging rate of said storage battery and said detected temperature stored therein, and a third memory having operational equations stored therein which are necessary for calculating at said detected temperature at least one of an effective electrical quantity which said storage battery can discharge and an effective time for which said storage battery can discharge an effective quantity of electricity based on said detected electrical quantities and detected temperature of said storage battery;
a digital-operation processing section for calculating at least one of said effective electrical quantity and effective time by digital-operation based on said output signals of said electrical quantity detecting section and temperature detecting section and said data and operational equations stored in said memory means;
an indicating section for indicating at least one of said effective electrical quantity and said effective time;
said digital-operation processing section acting to calculate said discharge capacity of said storage battery at said standard temperature based on said capacity of said storage battery measured by said capacity measuring section, said signal output by said temperature detecting section and said data stored in said memory means, and to allow said memory means to store said discharge capacity so calculated therein thereby correcting the variation in capacity of said storage battery due to the life variation thereof.

9. A system for measuring the state of charge of a storage battery as defined in claim 8, wherein said temperature detecting section comprises a temperature detector disposed adjacent to said storage battery and an analog-digital converter for converting an output of said temperature detector into said digital signal.

10. A system for measuring the state of charge of a storage battery as defined in claim 9, wherein said electrical quantity detecting section comprises an electrical quantity detector for integrating a charging current and a discharge current of said storage battery to detect said charging electrical quantity and discharge electrical quantity of said storage battery, respectively, and an analog-digital converter for converting outputs of said electrical quantity detector into said digital signals.

11. A system for measuring the state of charge of a storage battery as defined in claim 10, wherein said temperature detector and electrical quantity detector continuously operate, and said analog-digital converters, digital-operation processing section and memory means intermittently operate.

12. A system for measuring the state of charge of a storage battery as defined in claim 9, wherein said electrical quantity detecting section comprises a current detector for detecting a charging current and a discharge current of said storage battery, an analog-digital converter for converting outputs of said electrical quantity detector into said digital signals, and an operation means for integrating outputs of said analog-digital converter as a function of time.

13. A system for measuring the state of charge of a storage battery as defined in claim 12, wherein said temperature detector and current detector continuously operate; and said analog-digital converters, operation means, digital-operation processing section and memory means intermittently operate.

14. A system for measuring the state of charge of a storage battery as defined in claim 12 or 13, wherein said digital-operation processing section also acts as said operation means.

15. A system for measuring the state of charge of a storage battery comprising:

an electrical quantity detecting section for detecting the quantity of electricity charged to said storage battery and the quantity of electricity discharged therefrom, and outputting said detected electrical quantities as digital signals;

a temperature detecting section for detecting a temperature of said storage battery and outputting said detected temperature as a digital signal;

a time detecting section for integrating a shelf time for which said storage battery is connected to neither a load nor a charger and converting said integrated time into a digital signal;

a memory means including a first memory having at least data on the discharge capacity of said storage battery at said detected temperature with respect to the discharge capacity of said storage battery at a standard temperature stored therein, a second memory having data on the charging efficiency of said storage battery in relation to a charging rate of said storage battery and said detected temperature stored therein, and a third memory having operational equations stored therein which are necessary for calculating at said detected temperature at least one of an effective electrical quantity which said storage battery can discharge and an effective time for which said storage battery can discharge an effective quantity of electricity based on said detected electrical quantities and detected temperature of said storage battery and having operational equations stored therein which are necessary for calculating an electrical quantity of said storage battery lost due to the self-discharge thereof during said shelf time to correct said effective electrical quantity and said effective time;

a digital-operation processing section for obtaining the correction in variation of discharge capacity of said storage battery due to said self-discharge based on said output signals of said electrical quantity detecting section and temperature detecting section, said signal output by said time detecting section, and said data and operational equations stored in said memory means to calculate at least one of said effective electrical quantity and said effective time by digital-operation; and an indicating section for indicating at least one of said effective electrical quantity and said effective time.

16. A system for measuring the state of charge of a storage battery as defined in claim 15, wherein said temperature detecting section comprises a temperature detector disposed adjacent to said storage battery and an analog-digital converter for converting an output of said temperature detector into said digital signal.

17. A system for measuring the state of charge of a storage battery as defined in claim 16, wherein said electrical quantity detecting section comprises an electrical quantity detector for integrating a charging current and a discharge current of said storage battery to detect said charging electrical quantity and discharge electrical quantity of said storage battery, respectively, and an analog-digital converter for converting outputs of said electrical quantity detector into said digital signals.

18. A system for measuring the state of charge of a storage battery as defined in claim 17, wherein said temperature detector and electrical quantity detector continuously operate, and said analog-digital converters, digital-operation processing section and memory means intermittently operate.

19. A system for measuring the state of charge of a storage battery as defined in claim 16, wherein said electrical quantity detecting section comprises a current detector for detecting a charging current and a discharge current of said storage battery, an analog-digital converter for converting outputs of said electrical quantity detector into said digital signals, and an operation means for integrating outputs of said analog-digital converter as a function of time.

20. A system for measuring the state of charge of a storage battery as defined in claim 19, wherein said temperature detector and current detector continuously operate; and said analog-digital converters, operation means, digital-operation processing section and memory means intermittently operate.

21. A system for measuring the state of charge of a storage battery as defined in claim 19 or 20, wherein said digital-operation processing section also acts as said operation means.

22. A system for measuring the state of charge of a storage battery comprising:

an electrical quantity detecting section for detecting the quantity of electricity charged to said storage battery and the quantity of electricity discharged therefrom, and outputting said detected electrical quantities as digital signals;

a temperature detecting section for detecting the temperature of said storage battery and outputting said detected temperature as a digital signal;

a capacity measuring section for discharging electricity from said storage battery to a reference load connected to said storage battery to measure the capacity of said storage battery;

a time detecting section for integrating a shelf time for which said storage battery is connected to neither a load nor a charger and converting said integrated time into a digital signal;

a memory means including a first memory having at least data on the discharge capacity of said storage battery at said detected temperature with respect to the discharge capacity of said storage battery at a standard temperature stored therein, a second memory having data on the charging efficiency of said storage battery in relation to a charging rate of said storage battery and said detected temperature stored therein, and a third memory having operational equations stored therein which are necessary for calculating at said detected temperature at least one of a useful electrical quantity which said storage battery can discharge and a useful time for which said storage battery can discharge a useful quantity of electricity and having operational equations stored therein which are necessary for calculating an electrical quantity of said storage battery lost due to the self-discharge thereof during said shelf time to correct said useful electrical quantity and said useful time;

a digital-operation processing section for obtaining the correction in variation of discharge capacity of said storage battery due to said self-discharge based on said output signals of said electrical quantity detecting section and said temperature detecting section, said capacity of said storage battery measured by said capacity measuring section, said signal output by said time detecting section, and said data and operational equations stored by said memory means to calculate at least one of said useful electrical quantity and said useful time by digital-operation;

an indicating section for indicating at least one of said useful electrical quantity and said useful time;

said digital-operation processing section acting to calculate said discharge capacity of said storage battery at said standard temperature based on said capacity of said storage battery measured by said capacity measuring section, said temperature detected by said temperature detecting section and said data stored by said memory means, and to allow said memory means to store said calculated discharged capacity therein, thereby correcting the variation of discharge capacity of said storage battery due to the life variation thereof.

23. A system for measuring the state of charge of a storage battery as defined in claim 22, wherein said temperature detecting section comprises a temperature detector disposed adjacent to said storage battery and an analog-digital converter for converting an output of said temperature detector into said digtial signal.

24. A system for measuring the state of charge of a storage battery as defined in claim 23, wherein said electrical quantity detecting section comprises an electrical quantity detector for integrating a charging current and a discharge current of said storage battery to detect said charging electrical quantity and discharge electrical quantity of said storage battery, respectively, and an analog-digital converter for converting outputs of said electrical quantity detector into said digital signals.

25. A system for measuring the state of charge of a storage battery as defined in claim 24, wherein said temperature detector and electrical quantity detector continuously operate, and said analog-digital converters, digital-operation processing section and memory means intermittently operate.

26. A system for measuring the state of charge of a storage battery as defined in claim 25, wherein said electrical quantity detecting section comprises a current detector for detecting a charging current and a discharge current of said storage battery, an analog-digital converter for converting outputs of said electrical quantity detector into said digital signals, and an operation means for integrating outputs of said analog-digital converter as a function of time.

27. A system for measuring the state of charge of a storage battery as defined in claim 26, wherein said temperature detector, electrical quantity detector and time detecting section continuously operate; and said analog-digital converters, operation means, digital-operation processing section and memory means intermittently operate.

28. A system for measuring the state of charge of a storage battery as defined in claim 26 or 27, wherein said digital-operation processing section also acts as said operation means.

* * * * *

UNITED STATES PATENT AND TRADEMARK OFFICE
CERTIFICATE OF CORRECTION

PATENT NO. : 4,377,787

DATED : March 22, 1983

INVENTOR(S) : Takao Kikuoka et al.

It is certified that error appears in the above-identified patent and that said Letters Patent is hereby corrected as shown below:

Figures 1, 5 and 6 should be deleted to appear as per attached sheets.

Signed and Sealed this

Twenty-ninth Day of November 1983

[SEAL]

Attest:

GERALD J. MOSSINGHOFF

Attesting Officer     Commissioner of Patents and Trademarks